US009337296B2

(12) United States Patent
Pazhedan

(10) Patent No.: US 9,337,296 B2
(45) Date of Patent: May 10, 2016

(54) INTEGRATED CIRCUITS HAVING A METAL GATE STRUCTURE AND METHODS FOR FABRICATING THE SAME

(71) Applicant: GLOBALFOUNDRIES, Inc., Grand Cayman (KY)

(72) Inventor: Naseer Babu Pazhedan, Dresden (DE)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 13/947,161

(22) Filed: Jul. 22, 2013

(65) Prior Publication Data

US 2015/0021714 A1    Jan. 22, 2015

(51) Int. Cl.
| H01L 29/51 | (2006.01) |
| H01L 21/28 | (2006.01) |
| H01L 29/66 | (2006.01) |
| H01L 29/49 | (2006.01) |
| H01L 29/10 | (2006.01) |

(52) U.S. Cl.
CPC ........ *H01L 29/517* (2013.01); *H01L 21/28229* (2013.01); *H01L 29/511* (2013.01); *H01L 29/513* (2013.01); *H01L 29/6659* (2013.01); *H01L 29/66545* (2013.01); *H01L 29/1045* (2013.01); *H01L 29/4966* (2013.01); *H01L 29/6656* (2013.01)

(58) Field of Classification Search
USPC .......................................... 257/411; 438/591
See application file for complete search history.

(56) References Cited

U.S. PATENT DOCUMENTS

| 6,703,277 | B1 * | 3/2004 | Paton ................ H01L 21/28176 257/E21.01 |
| 2004/0092073 | A1 * | 5/2004 | Cabral, Jr. ............. C23C 16/405 438/287 |
| 2006/0197227 | A1 * | 9/2006 | Liang ................ H01L 21/28194 257/761 |
| 2007/0152276 | A1 * | 7/2007 | Arnold et al. ................. 257/369 |
| 2008/0318442 | A1 * | 12/2008 | Ogawa .................... C23C 16/40 438/785 |
| 2012/0217590 | A1 * | 8/2012 | Babich et al. ................. 257/410 |
| 2013/0189839 | A1 * | 7/2013 | Guillorn et al. ............... 438/675 |
| 2013/0264608 | A1 * | 10/2013 | Gauthier, Jr. ......... H01L 27/027 257/133 |
| 2014/0187030 | A1 * | 7/2014 | Ji .......................... H01L 29/401 438/587 |

OTHER PUBLICATIONS

Akbar et al., Electrical Performance and Reliability Improvement by Using Compositionally Varying Bi-Layer Structure of PVD HfSixOy Dielectric, IEEE Electron Device Letters, vol. 26, No. 3, Mar. 2005, p. 166-168.
Tseng et al., Mechanism of Gm Degradation and Comparison of Vt Instability and Reliability of HfO2, HfSiOx, and HfAlOx Gate Dielectrics with 80 nm Poly-Si Gate CMOS, VLSI Technology, 2005 IEEE VLSI-TSA International Symposium, Apr. 25-27, 2005.

* cited by examiner

*Primary Examiner* — Telly Green
*Assistant Examiner* — Lawrence Tynes, Jr.
(74) *Attorney, Agent, or Firm* — Ingrassia Fisher & Lorenz, P.C.

(57) ABSTRACT

Integrated circuits and methods for fabricating integrated circuits are provided. In an exemplary embodiment, a method for fabricating an integrated circuit includes forming an interfacial layer material over a semiconductor substrate and forming a gate insulation layer over the interfacial layer material that includes a combination of a layer of a hafnium oxide material and a layer of hafnium silicate material. The layer of the hafnium silicate material includes less than about 40 % of an overall height of the gate insulation layer.

20 Claims, 4 Drawing Sheets

INTEGRATED CIRCUITS HAVING A METAL GATE STRUCTURE AND METHODS FOR FABRICATING THE SAME

TECHNICAL FIELD

The present disclosure generally relates to integrated circuits and methods for fabricating integrated circuits. More particularly, the presented disclosure relates to integrated circuits having a metal gate structure and methods for fabricating the same.

BACKGROUND

The majority of present day integrated circuits (ICs) are implemented by using a plurality of interconnected field effect transistors (FETs), also called metal oxide semiconductor field effect transistors (MOSFETs), or simply MOS transistors. A MOS transistor includes a gate electrode as a control electrode and spaced apart source and drain regions, defining a transistor channel, between which a current may flow. A control voltage applied to the gate electrode controls the flow of current through a channel between the source and drain electrodes. Complementary MOS (CMOS) devices include a plurality of N-channel MOS (NMOS) transistors and a plurality of P-channel (PMOS) transistors. During the fabrication of complex integrated circuits using, for instance, MOS technology, millions of transistors, e.g., NMOS transistors and/or PMOS transistors, are formed on a substrate including a crystalline semiconductor layer.

In a field effect transistor, the conductivity of the channel region, i.e., the drive current capability of the conductive channel, is controlled by the gate electrode formed adjacent to the channel region and separated therefrom by a thin gate insulation layer. The conductivity of the channel region, upon formation of a conductive channel due to the application of an appropriate control voltage to the gate electrode, depends upon, among other things, the dopant concentration, the mobility of charge carriers therein and, for a given extension of the channel region in the transistor width direction, the distance between the source and drain regions, which is also referred to as the channel length of the transistor. Hence, in combination with the capability of rapidly creating a conductive channel below the insulating layer upon application of the control voltage to the gate electrode, the conductivity of the channel region substantially affects the performance of MOS transistors. Thus, since the speed of creating the channel, which depends in part on the conductivity of the gate electrode, and the channel resistivity substantially determine the characteristics of the transistor, the scaling of the channel length, and associated therewith the reduction of channel resistivity and the increase of gate resistivity, are dominant design efforts used to increase the operating speed of integrated circuits.

For many early device technology generations, the gate electrode structures of most transistor elements have included a plurality of silicon-based materials, such as a silicon dioxide and/or silicon oxynitride gate insulation layer, in combination with a polysilicon gate electrode. However, as the channel length of aggressively-scaled transistor elements has become increasingly smaller, many newer generation devices employ gate electrode stacks including alternative materials in an effort to avoid the short-channel effects that may be associated with the use of traditional silicon-based materials in reduced channel length transistors. For example, in some aggressively-scaled transistor elements, which may have channel lengths of the order of approximately 14 nm to about 32 nm, gate electrode stacks including a so-called high-k dielectric/metal gate (HK/MG) configuration have been shown to provide significantly enhanced operational characteristics over the heretofore more commonly used silicon dioxide/polysilicon (SiO/poly) configurations.

Depending on the specific overall device requirements, several different high-k materials (i.e., materials having a dielectric constant, or k-value, of approximately 3.7 or greater) have been used with varying degrees of success for the gate insulation layer in a HK/MG gate electrode structure. For example, in some transistor element designs, a high-k gate insulation layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$), and the like. Furthermore, one or more non-polysilicon metal gate electrode materials (i.e., a metal gate stack) may be used in HK/MG configurations so as to control the work function of the transistor. These metal gate electrode materials may include, for example, one or more layers of titanium (Ti), titanium nitride (TiN), titanium-aluminum (TiAl), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi), tungsten (W), and the like. Additionally, a work function modifying material, such as lanthanum (La) or Al, may be disposed in between the gate insulation layer and the metal gate electrode.

Of the above-noted gate insulation layer materials, hafnium-based materials are particularly desirable due to their relatively low cost and ease of deposition. Prior experimentation with various high-k gate insulation layer materials has revealed that transistors fabricated with $HfO_2$ desirably exhibit a relatively high drive current due to the relatively high k value of $HfO_2$. On the other hand, $HfO_2$ has been shown to be unstable under negative and positive voltage bias conditions, in a phenomenon known as negative or positive bias temperature instability (NBTI/PBTI). $HfSiO_x$, in contrast, has a better thermal stability and exhibits negligible NBTI or PBTI. However, transistors fabricated with $HfSiO_x$ undesirably exhibit a relatively low drive current due to the relatively low k value of $HfSiO_x$.

Accordingly, it is desirable to provide improved integrated circuits and methods for fabricating integrated circuits that include hafnium-based gate insulation layer materials. Additionally, it is desirable to provide such integrated circuits and methods for fabricating integrated circuits that exhibit both good temperature stability and a high drive current. Furthermore, other desirable features and characteristics of the present disclosure will become apparent from the subsequent detailed description and the appended claims, taken in conjunction with the accompanying drawings and the foregoing technical field and background.

BRIEF SUMMARY

Integrated circuits and methods for fabricating integrated circuits are provided. In one exemplary embodiment, an integrated circuit includes a semiconductor substrate, an interfacial layer over the semiconductor substrate, and a gate electrode stack over the interfacial layer having sidewall spacers disposed on sidewalls thereof. The gate electrode stack includes a gate insulation layer over the interfacial layer that includes a combination of a layer of a hafnium oxide material and a layer of hafnium silicate material. The layer of the hafnium silicate material includes less than about 40% of an overall height of the gate insulation layer.

In another exemplary embodiment, a method for fabricating an integrated circuit includes forming an interfacial layer material over a semiconductor substrate and forming a gate insulation layer over the interfacial layer material that includes a combination of a layer of a hafnium oxide material and a layer of hafnium silicate material. The layer of the hafnium silicate material includes less than about 40% of an overall height of the gate insulation layer.

In yet another exemplary embodiment, a method for fabricating an integrated circuit includes forming an interfacial layer material over a silicon-based semiconductor substrate and forming a gate insulation layer over the interfacial layer to a thickness of about 1 nm to about 5 nm. Forming the gate insulation layer includes forming a layer of a hafnium silicate over the interfacial layer to a thickness of about 1 Å to about 5 Å and forming a layer of a hafnium oxide over the layer of the hafnium silicate to a thickness of about 1 nm to about 5 nm, wherein the layer of the hafnium silicate material comprises less than about 25% of the thickness of the gate insulation layer. The method further includes forming a temporary gate electrode structure over the gate insulation layer and forming sidewall spacers adjacent to the temporary gate electrode structure. Still further, the method includes removing the temporary gate electrode structure leaving a gate recess region between the sidewall spacers and over the gate insulation layer and forming a metal gate electrode structure over the layer of the gate insulation layer and within the gate recess region.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely illustrative in nature and is not intended to limit the embodiments of the subject matter or the application and uses of such embodiments. Furthermore, there is no intention to be bound by any expressed or implied theory presented in the preceding technical field, background, brief summary or the following detailed description.

Embodiments of the present disclosure are directed to integrated circuit devices and associated fabrication methods that include hafnium-based high-k/metal gate transistor electrode insulation layers with improved thermal stability and improved current performance over devices and methods known in the prior art. The gate insulation layers are formed with two or more alternating layers of $HfO_2$ and $HfSiO_x$ in a configuration that achieves both a desirably high drive current and minimized NBTI/PBTI temperature instability. Various exemplary gate insulation layer configurations are described in greater detail below.

For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor based transistors are well known and so, in the interest of brevity, many conventional steps will only be mentioned briefly herein or will be omitted entirely without providing the well-known process details.

The techniques and technologies described herein may be utilized to fabricate MOS transistor devices, including NMOS transistor devices, PMOS transistor devices, and CMOS transistor devices. In particular, the process steps described here may be utilized in conjunction with any semiconductor device fabrication process that forms gate structures for transistors. Although the term "MOS device" properly refers to a device having a metal gate electrode and an oxide gate insulator, that term will be used throughout this disclosure to refer to any semiconductor device that includes a conductive metal gate electrode that is positioned over a hafnium-based gate insulator which, in turn, is positioned over a semiconductor substrate.

Figure 1:
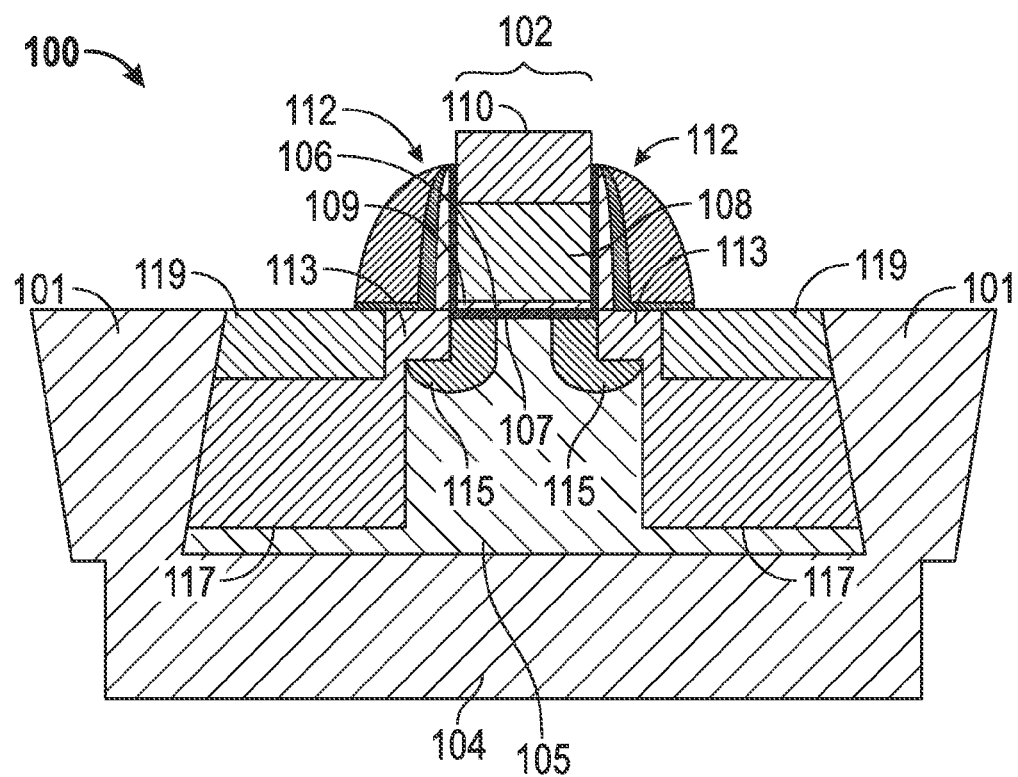
FIG. 1 illustrates, in cross section, an integrated circuit structure and a method for fabricating an integrated circuit structure in accordance with various embodiments of the present disclosure.

FIG. 1 illustrates, in cross section, an integrated circuit structure and a method for fabricating an integrated circuit structure in accordance with various embodiments of the present disclosure. In particular, FIG. 1 depicts the fabrication state of an integrated circuit device structure 100 after the formation of a gate stack structure 102 overlying a layer of semiconductor material 104. The device structure 100 is formed using well-known techniques and process steps (e.g., techniques and steps related to doping, photolithography and patterning, etching, material growth, material deposition, surface planarization, and the like) that will not be described in detail here. The semiconductor material 104 is preferably a silicon material as typically used in the semiconductor industry, e.g., relatively pure silicon as well as silicon admixed with other elements such as germanium, carbon, and the like. Alternatively, the semiconductor material 104 may be germanium, gallium arsenide, or the like. The semiconductor material 104 may be either N-type or P-type, but is commonly P-type, with one or more doped wells 105 formed therein. The semiconductor material 104 may be provided as a bulk semiconductor substrate, or it may be provided on a silicon-on-insulator (SOI) substrate, which includes a support substrate, an insulator layer on the support substrate, and a layer of silicon material on the insulator layer.

One or more isolation regions 101 may be formed that extend into semiconductor material 104 to electrically isolate a plurality of transistors from one another. The isolation regions 101 are preferably formed by well-known shallow trench isolation (STI) techniques in which trenches are etched into semiconductor material 104, the trenches are filled with a dielectric material such as deposited silicon dioxide, and the excess silicon dioxide is removed by chemical mechanical planarization (CMP). STI regions 101 provide electrical isolation, as needed, between various devices of the integrated circuit that are to be formed. Although STI regions 101 are initially filled with a dielectric material such as silicon dioxide, for devices formed in very thin (less than 20 nm) silicon layers, much of that dielectric material may be removed as a consequence of the many etching steps that occur throughout the fabrication process.

In some embodiments, the gate stack structure 102 includes, without limitation: an interfacial layer 107, such as a thermally formed silicon dioxide formed over the semiconductor material 104, a gate insulation layer 106 (which may be a combination of two or more high-k hafnium-based materials, such as hafnium oxide and hafnium silicate) overlying the interfacial layer 107; a metal gate electrode element 108 overlying the gate insulation layer 106; and one or more spacer structures 112 adjacent to vertical sidewalls of the gate electrode element 108. The gate stack structure 102 may also include a sacrificial capping layer 110 (which may be formed from a nitride, a silicide, or other material) formed over the gate electrode element 108. Further, the gate stack structure 102 may optionally include a work function modifying material 109, such as lanthanum (La) or aluminum (Al), which may be disposed in between the gate insulation layer 106 and the metal gate electrode element 108.

As noted above, interfacial layer may be formed by thermal oxidation of silicon, chemical treatment of silicon or alternatively it may be formed by the deposition of silicon dioxide on the semiconductor material 104. Thereafter, the metal gate stack structure 102 may be formed using either "gate first" or "gate last" process flows, as are well-known in the art. In one embodiment, the metal gate stack structure 102 is formed using a "gate first" metal gate process flow as will be described in greater detail below with continuing reference to FIG. 1 and with further reference to FIGS. 2-5.

Figure 2:
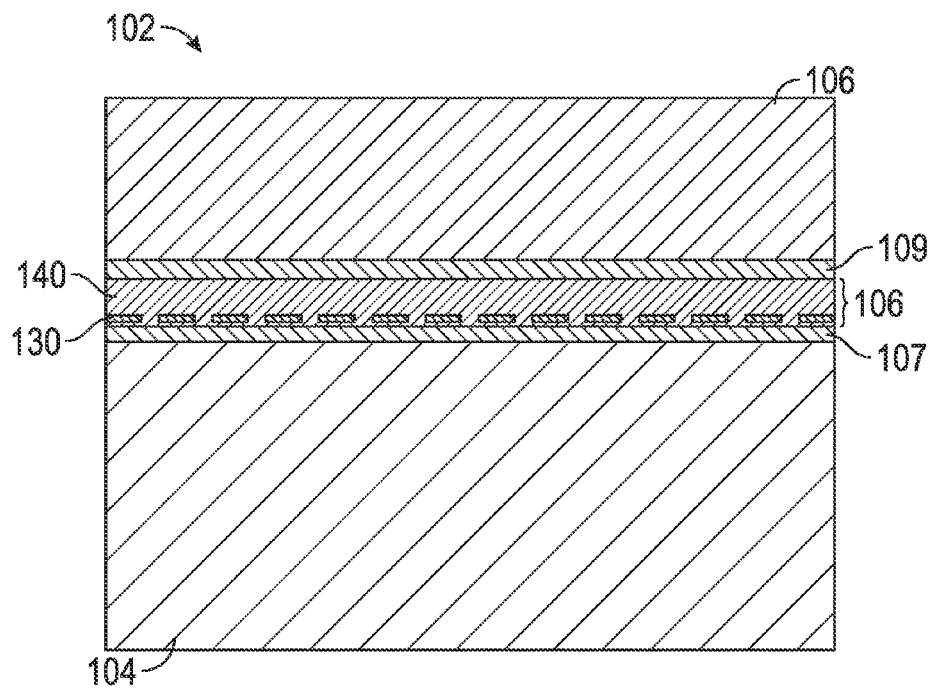
FIG. 2 illustrates, in cross section, a portion of the integrated circuit structure of FIG. 1, in particular the metal gate electrode stack thereof.

Formation of the metal gate stack 102, in a gate first process, begins with the formation of gate insulation layer 106. FIG. 2 illustrates, in cross section, a portion of the integrated circuit structure 100 of FIG. 1, in particular the metal gate electrode stack 102 thereof. As noted above, the material used for the gate insulation layer 106 may be a combination of two or more high-k hafnium-based materials, such as hafnium oxide and hafnium silicate. Layer 106 may be deposited, for example, by chemical vapor deposition (CVD), atomic layer deposition (ALD), low pressure chemical vapor deposition (LPCVD), or plasma enhanced chemical vapor deposition (PECVD) at a temperature from about 400° C. to about 1200° C. The overall thickness of the gate insulation layer 106, including the combined thickness of all hafnium-based materials deposited, is from about 1 nm to about 5 nm.

Layer 106, as shown in FIG. 2, is a combination of a layer of a hafnium silicate 130, such as $HfSiO_4$, which is deposited directly over the interfacial layer 107, and a layer of a hafnium oxide 140, such as $HfO_2$, which is deposited directly over the hafnium silicate layer 130. The layer of the hafnium silicate 130 is deposited to a thickness from about 1 Å to about 5 Å. The layer of the hafnium oxide 140, deposited over the layer 130, is deposited to a thickness from about 1 nm to about 5 nm, thus providing the overall thickness of layer 106 of about 1 nm to about 5 nm. As such, as an overall proportion of the combined hafnium-based gate insulation layer 106, the hafnium silicate forms less than about 40% of layer 106, such as less than about 25% of layer 106, for example less than about 10% of layer 106. By combining hafnium silicate with a conventional hafnium oxide layer in the amount and in the configuration disclosed, the desirable drive current qualities of hafnium oxide are retained, while its temperature stability under negative and positive voltage bias conditions is substantially improved.

Figure 3:
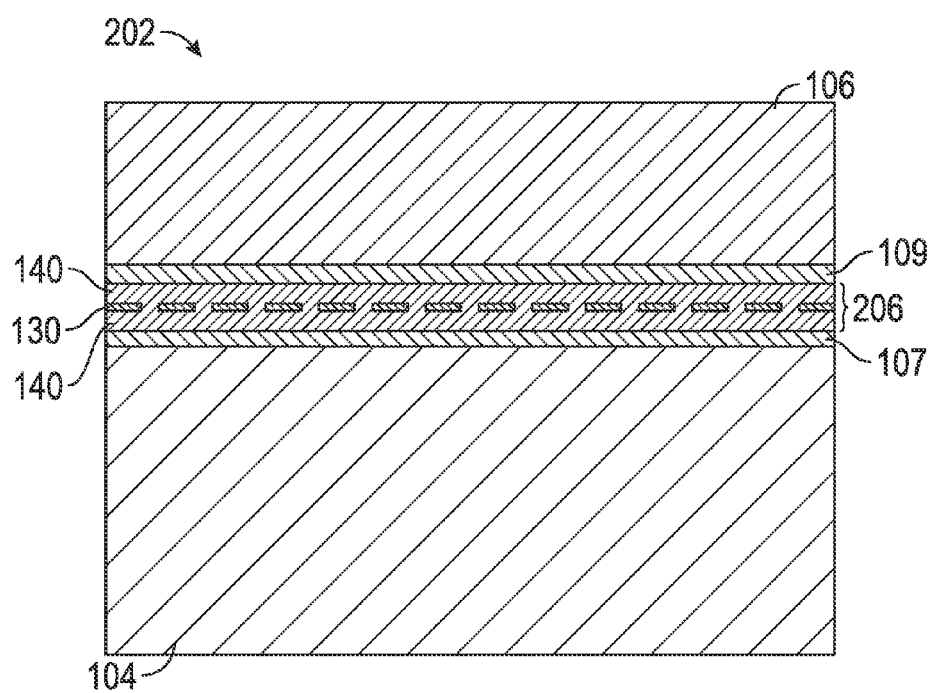
FIGS. 3-5 illustrate, in cross section, metal gate electrode stacks of integrated circuits in accordance with other embodiments of the present disclosure.
Figure 4:
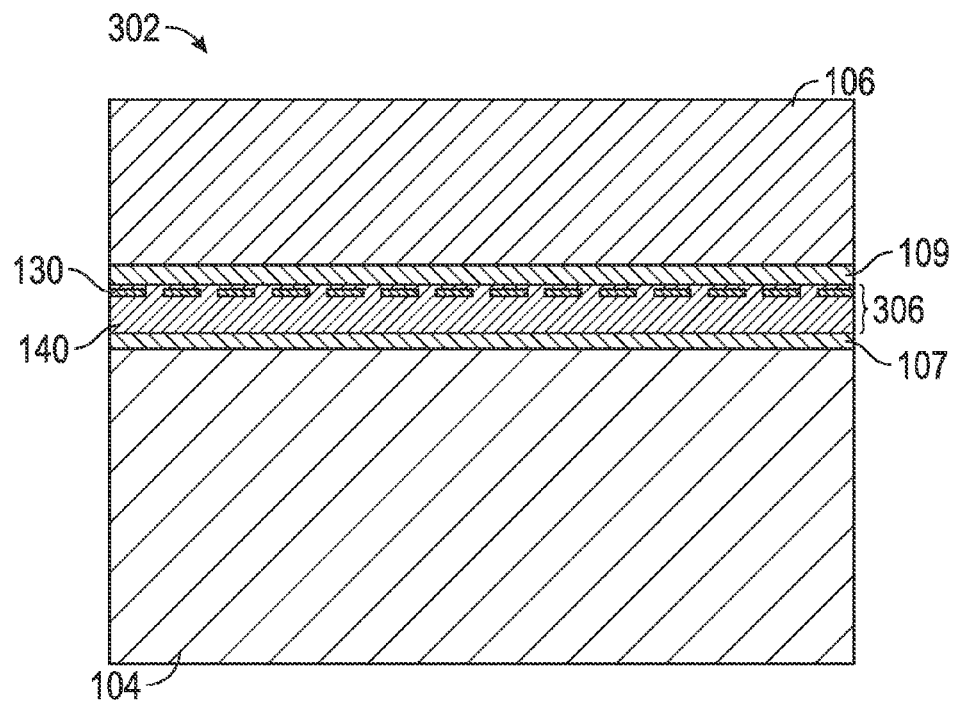
Figure 5:
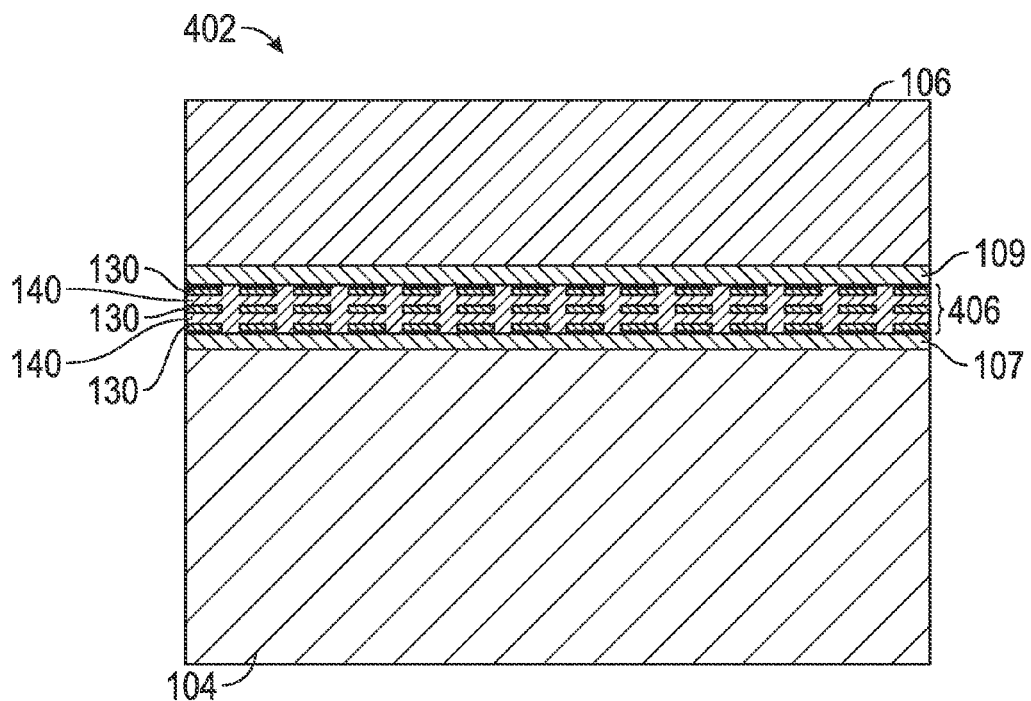

FIGS. 3-5 illustrate, in cross section, metal gate electrode stacks of integrated circuits (202, 302, and 402) in accordance with other embodiments of the present disclosure. As shown in FIG. 3, metal gate stack 202 includes gate insulation layer 206. Gate insulation layer 206 is a combination of a layer of a hafnium oxide 140, such as $HfO_2$, which is deposited directly over the interfacial layer 107, a layer of a hafnium silicate 130, such as $HfSiO_4$, which is deposited directly over the hafnium oxide layer 140, and a further layer of hafnium oxide 140, which is deposited directly over the layer of hafnium silicate 130. The layer of the hafnium silicate 130 is deposited to a thickness from about 1 Å to about 5 Å. The two layers of the hafnium oxide 140, which "sandwich" the deposited layer 130, are each deposited to a thickness from about 1 nm to about 3 nm, thus providing the overall thickness of layer 206 of about 1 nm to about 5 nm.

As shown in FIG. 4, in another embodiment, metal gate stack 302 includes gate insulation layer 306. Gate insulation layer 306 is a combination of a layer of a hafnium oxide 140, such as $HfO_2$, which is deposited directly over the interfacial layer 107, and a layer of a hafnium silicate 130, such as $HfSiO_4$, which is deposited directly over the hafnium oxide layer 140. The layer of the hafnium silicate 130 is deposited to a thickness from about 1 Å to about 5 Å. The layer of the hafnium oxide 140, deposited underneath the layer 130, is deposited to a thickness from about 1 nm to about 5 nm, thus providing the overall thickness of layer 306 of about 1 nm to about 5 nm.

Furthermore, as shown in FIG. 5, in yet another embodiment, metal gate stack 402 includes gate insulation layer 406. Gate insulation layer 406 is a combination of a layer of a hafnium silicate 130, such as $HfSiO_4$, which is deposited directly over the interfacial layer 107, a layer of a hafnium oxide 140, such as $HfO_2$, which is deposited directly over the hafnium silicate layer 130, a further layer of hafnium silicate 130, which is deposited directly over the layer of hafnium oxide 140, a further layer of hafnium oxide 140, which is deposited directly over the further layer of hafnium silicate 130, and a final layer of hafnium silicate 130, which is deposited over the further layer of hafnium oxide 140. The three layers of the hafnium silicate 130 are each deposited to a thickness from about 1 Å to about 5 Å. The two layers of the hafnium oxide 140, which are "sandwiched" within the three layers 130, are each deposited to a thickness from about 0.5 nm to about 2.5 nm, thus providing the overall thickness of layer 406 of about 1 nm to about 5 nm.

Returning to FIG. 1, and continuing with the description of the exemplary gate first process flow, the work function modifying material 109 is optionally deposited subsequent to the formation of layer 106 and, as noted above, may include one or more of La and Al, for example. Material 109 may be deposited using a suitable deposition technique such as atomic layer deposition (ALD), CVD, LPCVD, semi-atmospheric chemical vapor deposition (SACVD), or PECVD. The work function modifying material 109 may be deposited to a thickness sufficient to achieve the desired work function modification effect, such as from about 2 Å to about 2 nm.

Thereafter, the gate electrode element 108 may be formed by electroplating, CVD, ALD, or PVD. In some embodiments, the gate electrode element 108 is conformally deposited in the recess using CVD or ALD. The gate electrode element 108 may be formed to a thickness from about 5 nm to about 50 nm. The gate electrode element 108 may be a metal such titanium (Ti), titanium nitride (TiN), titanium-aluminum (TiAl), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi), tungsten (W), and the like. In one embodiment, the gate electrode element 108 includes TiN. The capping layer 110 may thereafter be deposited to a thickness sufficient to protect underlying gate stack from further processes, using a material such as silicon nitride.

The spacer structures 112 may thereafter be formed by conformally depositing one or more dielectric materials over the silicon material 104 and the metal gate stack 102, where the dielectric material is an appropriate insulator, such as silicon nitride. The dielectric spacer material(s) may be deposited in a known manner by, for example, atomic layer deposition (ALD), CVD, LPCVD, semi-atmospheric chemical vapor deposition (SACVD), or PECVD. The layer of dielectric spacer material is deposited to a thickness so that, after anisotropic etching, the spacer structures 112 formed from the layer have a thickness that is appropriate for the subsequent process steps described below. In some embodiments, the layer of dielectric spacer material is deposited to a thickness of about 5 nm to about 50 nm. The process continues, in accordance with an exemplary embodiment, with anisotropic etching of the layer(s) of dielectric spacer material(s) to form the spacer structures 112, as illustrated in FIG. 1. The layer(s) of dielectric spacer material(s) may be etched by, for example, RIE using a suitable etching chemistry.

Figure 6:
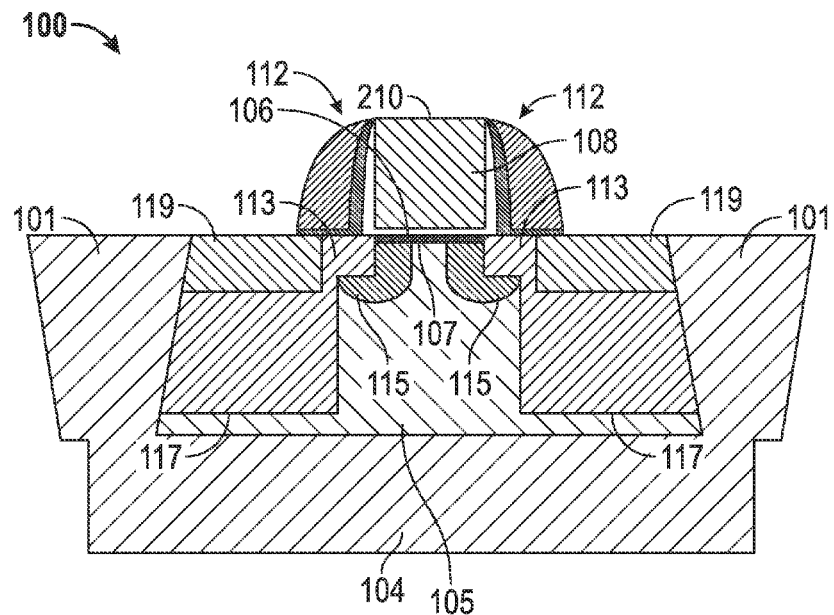
FIGS. 6-7 illustrate, in cross section, an integrated circuit structure and a method for fabricating an integrated circuit structure in accordance with further embodiments of the present disclosure.

The spacer structures 112 may be provided to protect the underlying semiconductor material 104 during ion implantation processes associated with the formation of source/drain extension implant regions 113, halo implant regions 115, and/or deep source/drain implant regions 117, as is well understood. The spacer structures 112 may be removed after completion of the various ion implantation steps (and/or the completion of the process steps that utilize the spacer structures 112). Ion implantation to form the source/drain extension implant regions 113, halo implant regions 115, and/or deep source/drain implant regions 117 may be realized by exposing the semiconductor substrate to a dopant ion implantation process. For example, the implant regions may be performed by exposing semiconductor material 104 to an ionizing environment with an ionic dopant species that is directed downward towards the semiconductor material 104. Suitable dopants for this process may include the various ions of boron (B), aluminum (Al), indium (In), phosphorus (P), arsenic (As), antimony (Sb), or any combination thereof In an alternative embodiment, the metal gate stack 102 is fabricated using gate last or replacement metal gate (RMG) techniques that are well known in the art. For example, with reference to FIG. 6, the interfacial layer 107 and the gate insulation layer 106 are provided as described above with respect to FIGS. 1-5. Thereafter, a temporary or "dummy" gate element 210 may be initially provided over the gate insulation layer 106 that includes polycrystalline silicon, although other replaceable materials could be used instead of polycrystalline silicon. Optionally, an etch stop layer of a suitable dielectric material (not shown) is first provided over the gate insulation layer 106 to protect the gate insulation layer during a subsequent etching step to remove the dummy gate element 210, as will be described in greater detail below. The dummy gate element 210 is provided by depositing a layer of polycrystalline silicon, e.g., using LPCVD by the hydrogen reduction of silane. Typically, the polycrystalline silicon layer will have a thickness within the range of about 50 nm to about 100 nm. The polycrystalline silicon layer is etched using an appropriate etch mask and etch chemistry to form dummy gate element 210. Subsequently, the spacer structures 112, the source/drain extension implant regions 113, halo implant regions 115, and/or deep source/drain implant regions 117 may be formed using the procedures described above with regard to FIG. 1.

Figure 7:
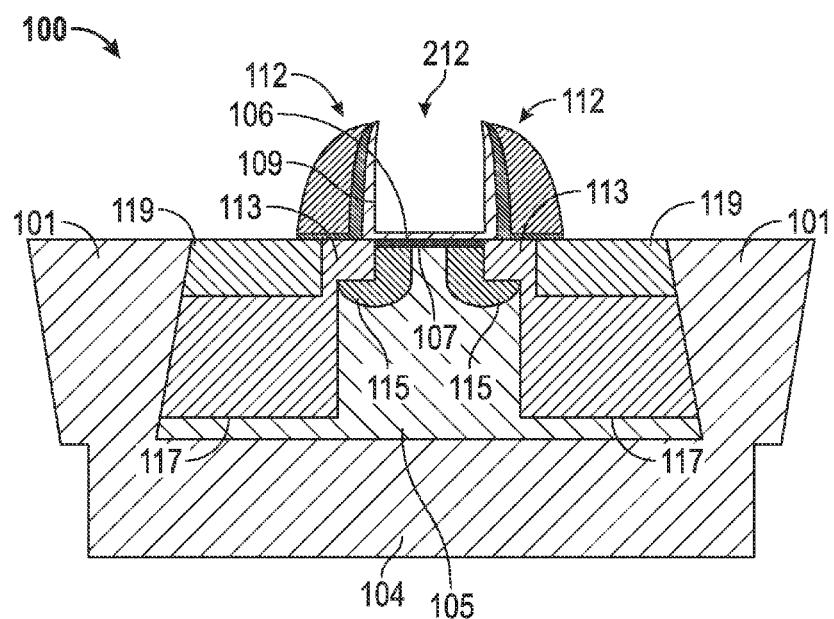

With reference now to FIG. 7, the temporary gate element 210 is later removed using an appropriate etchant chemistry that selectively etches the material used for the temporary gate element, leaving a gate recess region 212. The etchant chemistry, the etching conditions, the duration of the etching process, and other factors may be controlled as needed to ensure that the temporary gate element 210 is removed. The replacement gate process continues by filling the gate recess region 212 with the work function modifying material 109 (optional), metal gate electrode element 108, and sacrificial capping layer 110, as described above with regard to FIG. 1.

Although not illustrated, with regard to any of the embodiments described above, the partially-formed integrated circuit is completed in a conventional manner by, for example, providing electrical contacts to the source and drain regions and to the gate electrodes, depositing interfacial layers, etching contact vias, filling the contact vias with conductive plugs, and the like as are well known to those of skill in the art of fabricating integrated circuits. Additional post-processing may include the formation of one or more metal layers (M1, M2, etc.) and interfacial layer layers there between to complete the various electrical connections in the integrated circuit. The present disclosure is not intended to exclude such further processing steps as are necessary to complete the fabrication of a functional integrated circuit, as are known in the art.

Thus, embodiments of the present disclosure provide integrated circuit devices and associated fabrication methods that include hafnium-based high-k/metal gate transistor electrode insulation layers with improved thermal stability and improved current performance over devices and methods known in the prior art. The gate insulation layers are formed with two or more alternating layers of $HfO_2$ and $HfSiO_x$ in a configuration that achieves both a desirably high drive current and minimized NBTI/PBTI temperature instability.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method for fabricating and integrated circuit comprising:
    forming an interfacial layer material over and in physical contact with a semiconductor substrate, wherein the interfacial layer material comprises silicon dioxide; and
    forming a gate insulation layer over and in physical contact with the interfacial layer material that comprises a combination of a layer of a hafnium oxide material and a layer of hafnium silicate material, wherein the layer of the hafnium silicate material comprises less than about 40% of an overall height of the gate insulation layer, and wherein the layer of hafnium silicate material is disposed between at least a portion of the hafnium oxide layer and the interfacial material layer.

2. The method of claim 1, wherein forming the gate insulation layer comprises forming the gate insulation layer wherein the layer of the hafnium silicate material comprises less than about 25% of the overall height of the gate insulation layer.

3. The method of claim 2, wherein forming the gate insulation layer comprises forming the gate insulation layer wherein the layer of the hafnium silicate material comprises less than about 10% of the overall height of the gate insulation layer.

4. The method of claim 1, further comprising forming a layer of a work function modifying material over the gate insulation layer and over the interfacial layer.

5. The method of claim 4, wherein forming the layer of the work function modifying material comprises forming a layer of an aluminum material or a layer of a lanthanum material.

6. The method of claim 4, wherein further comprising forming a metal gate electrode structure over the layer of the work function modifying material, over the gate insulation layer, and over the interfacial layer.

7. The method of claim 6, wherein forming the metal gate electrode structure comprises forming a titanium nitride metal gate electrode structure.

8. The method of claim 6, further comprising forming a dielectric capping layer over the metal gate electrode structure, over the workfunction modifying material layer, over the gate insulation layer, and over the interfacial layer.

9. The method of claim 1, wherein forming the gate insulation layer comprises forming the gate insulation layer comprising a combination of two layers of the hafnium oxide material and a layer of the hafnium silicate material.

10. The method of claim 9, wherein forming the gate insulation layer comprises forming the gate insulation layer comprising a combination of two layers of the hafnium oxide material and three layers of the hafnium silicate material, wherein the two layers of the hafnium oxide material are alternatingly disposed between the three layers of the hafnium silicate material.

11. An integrated circuit comprising:
a semiconductor substrate;
an interfacial layer over and in physical contact with the semiconductor substrate, wherein the interfacial layer material comprises silicon dioxide; and
a gate electrode stack over and in physical contact with the interfacial layer, wherein the gate electrode stack comprises a gate insulation layer over the interfacial layer that comprises a combination of a layer of a hafnium oxide material and a layer of hafnium silicate material, wherein the layer of the hafnium silicate material comprises less than about 40% of an overall height of the gate insulation layer, and wherein the layer of hafnium silicate material is disposed between at least a portion of the hafnium oxide layer and the interfacial material layer.

12. The integrated circuit of claim 11, wherein the layer of the hafnium silicate material comprises less than about 25% of the overall height of the gate insulation layer.

13. The integrated circuit of claim 11, wherein the gate electrode stack further comprises a layer of a work function modifying material over the gate insulation layer.

14. The integrated circuit of claim 13, wherein the work function modifying material comprises a layer of an aluminum material or a layer of a lanthanum material.

15. The integrated circuit of claim 13, wherein the gate electrode stack further comprises a metal gate electrode structure over the layer of the work function modifying material.

16. The integrated circuit of claim 15, wherein the metal gate electrode structure comprises a titanium nitride metal material.

17. The integrated circuit of claim 11, wherein the gate insulation layer comprises a combination of two layers of the hafnium oxide material and a layer of the hafnium silicate material.

18. The integrated circuit of claim 17, wherein the gate insulation layer comprises a combination of two layers of the hafnium oxide material and three layers of the hafnium silicate material, wherein the two layers of the hafnium oxide material are alternatingly disposed between the three layers of the hafnium silicate material.

19. The integrated circuit of claim 11, wherein the semiconductor substrate further comprises a halo implant region.

20. A method for fabricating and integrated circuit comprising:
forming an interfacial layer material over and in physical contact with a silicon-based semiconductor substrate, wherein the interfacial layer comprises silicon dioxide;
forming a gate insulation layer over and in physical contact with the interfacial layer to a thickness of about 1 nm to about 5 nm, wherein forming the gate insulation layer comprises:
forming a layer of a hafnium silicate over and in physical contact with the interfacial layer to a thickness of about 1Å to about 5Å; and
forming a layer of a hafnium oxide over and in physical contact with the layer of the hafnium silicate to a thickness of about 1 nm to about 5 nm, wherein the layer of the hafnium silicate material comprises less than about 25% of the thickness of the gate insulation layer;
forming a temporary gate electrode structure over the gate insulation layer and over the interfacial layer;
forming sidewall spacers adjacent to the temporary gate electrode structure;
removing the temporary gate electrode structure leaving a gate recess region between the sidewall spacers and over the gate insulation layer; and
forming a metal gate electrode structure over the gate insulation layer and within the gate recess region.

* * * * *